United States Patent [19]
Suzuki et al.

[11] Patent Number: 4,748,488
[45] Date of Patent: May 31, 1988

[54] MASTER-SLICE-TYPE SEMICONDUCTOR INTEGRATED CIRCUIT DEVICE

[75] Inventors: Hirokazu Suzuki, Yamato; Takehiro Akiyama; Teruo Morita, both of Kawasaki, all of Japan

[73] Assignee: Fujitsu Limited, Kawasaki, Japan

[21] Appl. No.: 653,523

[22] Filed: Sep. 24, 1984

[30] Foreign Application Priority Data

Sep. 29, 1983 [JP] Japan ................................. 58-179265

[51] Int. Cl.⁴ ............................................. H01L 27/04
[52] U.S. Cl. ........................................ 357/45; 357/40; 307/467
[58] Field of Search ............................ 357/41, 45, 40; 307/455, 467

[56] References Cited

U.S. PATENT DOCUMENTS

| | | | |
|---|---|---|---|
| 3,866,066 | 2/1975 | Pedersen | 357/44 |
| 3,999,214 | 12/1976 | Cass | 357/41 |
| 4,056,810 | 11/1977 | Hart et al. | 357/44 |
| 4,336,528 | 6/1982 | Kane | 357/45 |

FOREIGN PATENT DOCUMENTS 2011706 7/1979 United Kingdom .

OTHER PUBLICATIONS

Review of Electrical Communication Laboratories, vol. 26, Nos. 9–10, Sep.–Oct. 1978, K. Wada et al. "Master–Slice Layout Design for Emitter Coupled Logic LSI" pp. 1355–1366.

Primary Examiner—William D. Larkins
Attorney, Agent, or Firm—Staas & Halsey

[57] ABSTRACT

A master-slice-type semiconductor integrated circuit device including basic cells, each having at least one logical circuit element, and current source cells for supplying current to the basic cells, each having at least one current source element and separated from the basic cells. A logic circuit operatively connects at least one logical circuit element in one of the basic cells and at least one current source element in one of the current source cells. The basic cells are arranged in groups extending in a lateral direction of the device and form cell rows in the lateral direction with groups of current source cells periodically formed in each cell row. The groups of current source cells in different cells rows are aligned in a longitudinal direction perpendicular to the lateral direction. The logic circuit is connected by conductive strips formed in wiring channels, each wiring channel being formed parallel and adjacent to at least one cell row.

59 Claims, 10 Drawing Sheets

Fig. 8(A)   Fig. 8(B)
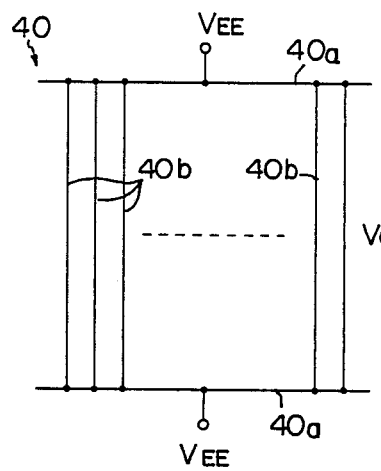
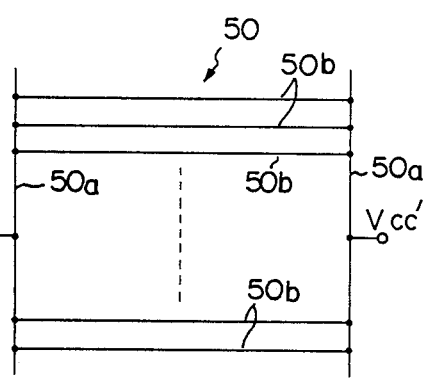
Fig. 9(A)
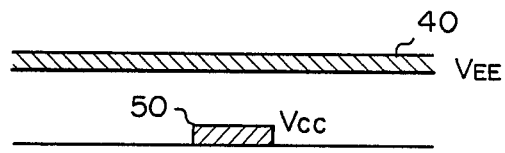
Fig. 9(B)
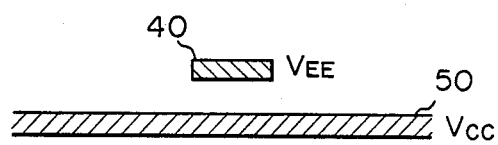

MASTER-SLICE-TYPE SEMICONDUCTOR INTEGRATED CIRCUIT DEVICE

BACKGROUND OF THE INVENTION

1. Field of the Invention

The present invention relates to a semiconductor integrated circuit device, more particularly to a master-slice-type semiconductor integrated circuit device including a plurality of logic circuits.

2. Description of the Related Art

Master-slice-type semiconductor integrated circuit (IC) devices are advantageous in that they allow the fast, efficient production of smaller lots of diverse semiconductor IC devices.

In the master-slice manufacturing method, a set of mask patterns common for various semiconductor IC devices is designed. Using this set of common mask patterns, a large number of semifinished devices are manufactured by a common process. This process stops with the diffusion step. Each semifinished device has the same circuit element cells, each including at least one logic circuit, such as an OR gate, and at least one current source, for driving the logic circuit. Using the semifinished devices, the desired finished devices are then produced by a predetermined wiring process which operatively connects the mutual circuit cells and connects the circuit cells and input/output portions to obtain a specific connection pattern. Thus, various semiconductor IC devices, having desired circuit constructions, can be easily formed.

Normally, a semiconductor IC device has hundreds to thousands of circuit element cells. Therefore, a large number of wiring connections are required. For this purpose, wiring channels are arranged around the circuit element cells. The higher the density of the semiconductor IC device, the smaller the wiring channel region and the more complex the wiring connection. Therefore, in the prior art semiconductor IC devices, there are strict requirements imposed on wiring design, such as minimizing the connection wire length in consideration of the spatial relationship between the circuit element cells and the space of the wiring channels and preventing the occurrence of inconnectable circuit element cells on the chip, which result in low efficiency of utilization of the semiconductor IC device.

Prior art master-slice-type semiconductor IC devices particularly suffer from insufficient design flexibility for forming the desired circuit combinations, since certain logic gates and certain current sources are standardly formed in each circuit element cell for possible connection in the cell. This lack of design flexibility further reduces the rate of utilization of the circuit element cells of the prior art master-slice-type semiconductor IC devices.

Similarly, prior art master-slice-type semiconductor IC devices suffer from complicated arrangements of power feeding means. Each power feeding means forms two layers, each consisting of a plurality of parallel conductive strips. The parallel strips of the higher and lower layers of each power feeding means intersect perpendicularly with each other to form a lattice like-structure. This has the disadvantages of low manufacturing efficiency and complicated wiring connection.

SUMMARY OF THE INVENTION

An object of the present invention is to provide a semiconductor integrated circuit device with greater flexibility in the formation of desired logic circuits therein by the provision of basic cells and of current source cells arranged adjacent to but separate from the basic cells.

Another object of the present invention is to provide a semiconductor integrated circuit device with easier wiring connections for formation of desired logic circuits by the provision of a specific arrangement of the basic cells, current source cells, and wiring channels.

Still another object of the present invention is to provide a semiconductor integrated circuit device with a simple construction for power feeding means to improve the manufacturing efficiency and simplify the wiring connection to the basic cells and current source cells.

Still another object of the present invention is to provide a semiconductor integrated circuit device with a substantially improved rate of utilization of the basic cells and the current source cells.

According to the present invention, there is provided a master-slice-type semiconductor integrated circuit device including basic cells, each having at least one logical circuit element, and current source cells for supplying current to the basic cells, each having at least one current source element. Each logic circuit can be formed by operatively connecting at least one logical circuit element in a basic cell and at least one current source element in a current source cell.

In addition, according to the present invention, there is provided a master-slice-type semiconductor integrated circuit device further including wiring channels for accommodating conductive strips connecting a logical circuit element in one basic cell and a logical circuit element in another basic cell, connecting a logical circuit element and a current source element, and connecting other elements. Each wiring channel is adjacent to at least one of as the basic cells and at least one of the current source cells.

Furthermore, according to the present invention, there is provided a master-slice-type semiconductor integrated circuit device including basic cells, each having at least one logical circuit element; current source cells for supplying current to the basic cells, each having at least one current source element; and first and second power feeding means for supplying current to the basic cells and the current source cells to drive them. The first and second power feeding means are formed on different, single layers. Each logic circuit can be formed by operatively connecting at least one logical circuit element in a basic cell and at least one current source element in a current source cell.

BRIEF DESCRIPTION OF THE DRAWINGS

Other objects and features of the present invention will be clearly understood with reference to the accompanying drawings, in which:

FIGS. 8(A) and 8(B) are views of the power feeding means shown in FIG. 6;

FIGS. 9(A) and 9(B) are sectional views of the power feeding means shown in FIGS. 8(A) and 8(B);

DESCRIPTION OF THE PREFERRED EMBODIMENTS

Figure 1:
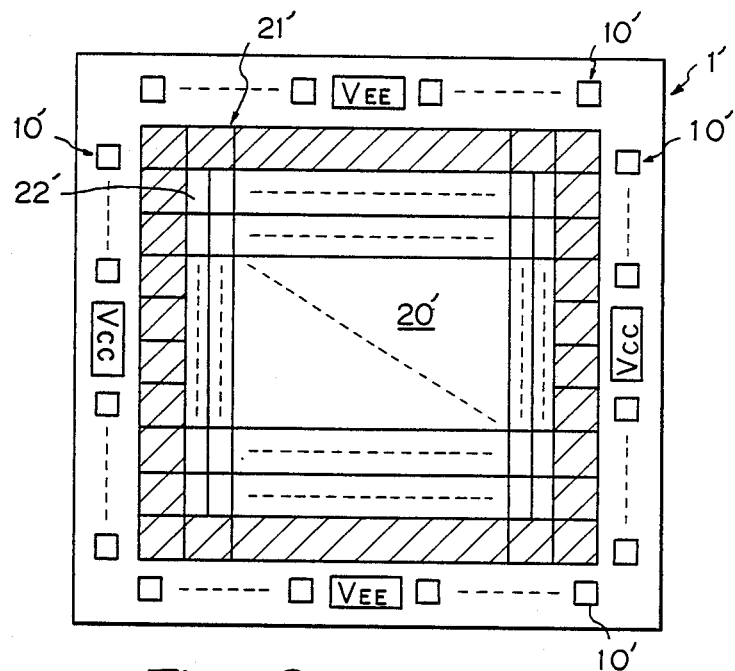
FIG. 1 is a conceptual plan view of an arrangement of circuit element cells on a semiconductor chip in accordance with the prior art.

Before describing preferred embodiments of the present invention, additional details will be given of the prior art for reference. Referring to FIG. 1, a semiconductor chip $1'$ of a prior art master-slice-type semiconductor IC device is illustrated in a conceptual plane view. In FIG. 1, there is illustrated a circuit element cell array $20'$ consisting of a plurality of circuit element cells $22'$ arranged in a matrix, each cell having at least one logic gate circuit element, using emitter coupled logic (ECL), and at least one current source for providing a constant current to the logic gate circuit element. Also illustrated in FIG. 1 is an input/output (I/O) cell group $21'$ arranged around the circuit element cell array $20'$ and functioning as an interface between an external circuit (not shown) and an internal circuit formed in the circuit element cell array $20'$. Hundreds to thousands of the circuit element cells $22'$ are provided for forming logic gate circuits, each circuit element cell $22'$ including low-power-consuming gates. On the other hand, the I/O cell group $21'$ must drive the external circuit, therefore, each I/O cell includes high-power-consuming heavy-duty logic gates. A plurality of bonding pads $10'$ are also provided at the circumferential portion of the semiconductor chip $1'$ and are connected to pins of the semiconductor IC device for connecting input or output signal wires.

Figure 2:
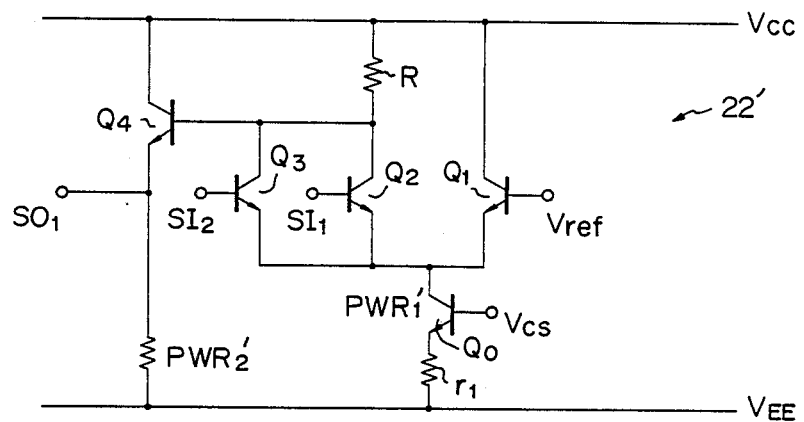
FIG. 2 is a circuit diagram of a logic gate circuit formed in the semiconductor chip shown in FIG. 1.

Each circuit element cell $22'$ forms a gate circuit, for example, as shown in FIG. 2. The gate circuit shown in FIG. 2 is an emitter-coupled-logic (ECL) circuit formed by transistors $Q_1$ to $Q_4$, current sources $PWR_1'$ to $PWR_3'$, and resistors $R$ and $r_1$. $V_{ref}$ designates a reference voltage, $V_{CS}$ a bias voltage, $V_{CC}$ and $V_{EE}$ power source voltages. The ECL circuit in FIG. 2 is an OR gate with two inputs $SI_1$ and $SI_2$ and one output $SO_1$. These inputs and output are operatively connected to the bonding pads through the I/O cell group $21'$.

Figure 3:
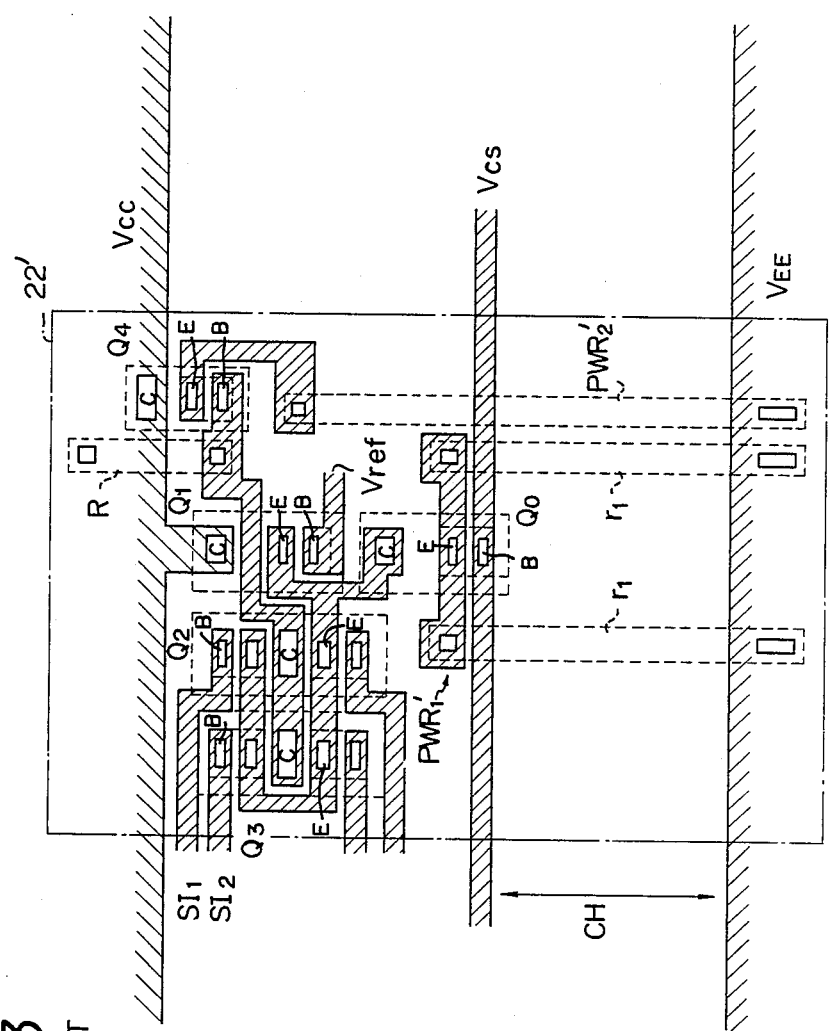
FIG. 3 is a plane view of the arrangement and connection of circuit element cells for forming the logic gate circuit on the semiconductor chip shown in FIG. 1.

FIG. 3 is a pattern view of the semiconductor device in which is formed the circuit element cell $22'$ of the circuit shown in FIG. 2. In FIG. 3, parts similar to those in FIG. 2 bear the same references. References B, E, and C in the transistors $Q_0$ to $Q_4$ designate a base, an emitter, and a collector of the transistors. Reference CH designates a wiring channel.

In the master-slice-method, the elements $Q_0$ to $Q_4$, R, $r_1$, $PWR_1'$, and $PWR_2'$ and the power feeding strips of the power sources $V_{CC}$ and $V_{EE}$ are commonly formed in every semifinished IC device. To obtain the logical gate circuit shown in FIG. 2 for the final IC device, for example, the shaded wiring lines (except $V_{CC}$ and $V_{EE}$) are later formed. Input signal strips and an output signal strip are provided on the wiring channel region CH to operatively connect other circuit elements in other circuit element cells or I/O cells.

In the ECL gate circuit, in order to improve an switching speed or to increase the ability for driving the output circuit, it is necessary to increase the electrical current of the current source $PWR_1'$ or to change the resistance value of the resistor forming the current source $PWR_2'$. The elements in the circuit element cell $22'$, however, are standardly formed for a low-power-consuming logic gate circuit. As a result, it is not easy to meet the above requirements. Likewise, the circuit construction in the I/O cells is standard.

If a higher speed ECL gate circuit is required, one possible approach is to use two or more current sources $PWR_1'$ from two or more circuit element cells $22'$ as shown in FIG. 3 to form a single ECL gate circuit. For this purpose, it is necessary to provide a connection wire to the collector C in the transistor $Q_0$. This, however, is very difficult, because the transistors $Q_0$ to $Q_4$ are closely arranged to improve interconnection between them. Even if the wire can be connected to the collector C, it is difficult to lead the wire to the desired circuit element cell through the wire channel CH due to the large number of connection wires in the neighbouring wire channel CH. In addition, this approach results in a low rate of utilization of the circuit element cells, since a circuit element cell partially used for forming another logic gate circuit is no longer available for another use.

To facilitate provision of a connection wire to the collector C, it is, of course, possible to enlarge the distance between the elements in the circuit element cell. This, however, reduces the degree of integration of the semiconductor device. Aside from using the current sources from several circuit element cells, it is also possible to provide redundant elements in every circuit element cell. This is also clearly disadvantageous in that it reduces the degree of integration.

Figure 4:
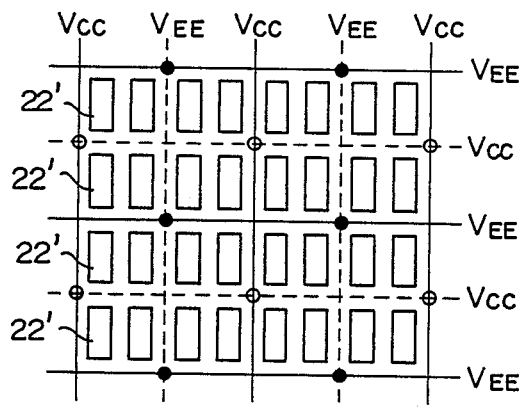
FIG. 4 is a more detailed semiconductor chip of FIG. 1, showing a plurality of circuit element cells in a matrix and two power feeding means in a lattice.
Figure 5A:
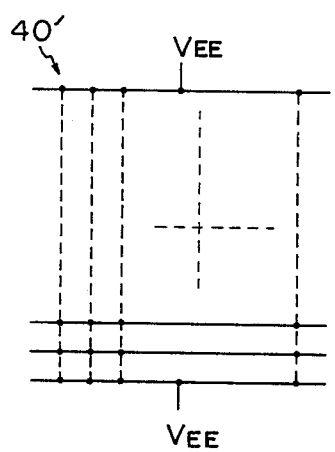
FIGS. 5(A) and 5(B) are views of the power feeding means shown in FIG. 4.
Figure 5B:
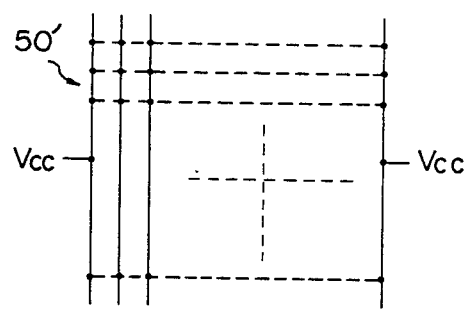

FIG. 4 illustrates in detail an arrangement of the circuit element cells $22'$ and the power feeding means of the power sources $V_{EE}$ and $V_{CC}$. FIGS. 5(A) and 5(B) are plane views of the above feeding means. Each of power feeding means $40'$ and $50'$ is formed by a double layer, one layer shown by dotted lines and formed at a first (lower) layer in the chip $1'$, the other shown by solid lines and formed at a second (higher) layer in the chip $1'$. Each layer comprises a plurality of parallel conductive strips, the strips of one layer running perpendicular to the strips of the other layer to form a lattice-like structure. In FIG. 4, through holes connecting the upper and lower strips are indicated as black points on the cross portions of the power feeding means $40'$ and as small circles on the cross portions of the power feeding means 50'. The lattice-formed power feeding means 40' and 50' are shifted a half pitch in the lateral and longitudinal directions so that one conductive strip is always close to a circuit element cell 22'.

Formation of the power feeding means 40' and 50' involves a relatively complex process, resulting in low manufacturing efficiency. In addition, the arrangement of the lattice-like power feeding means may prevent the optimum connection for forming the logic gate circuits in the semiconductor chip 1'.

Figure 6:
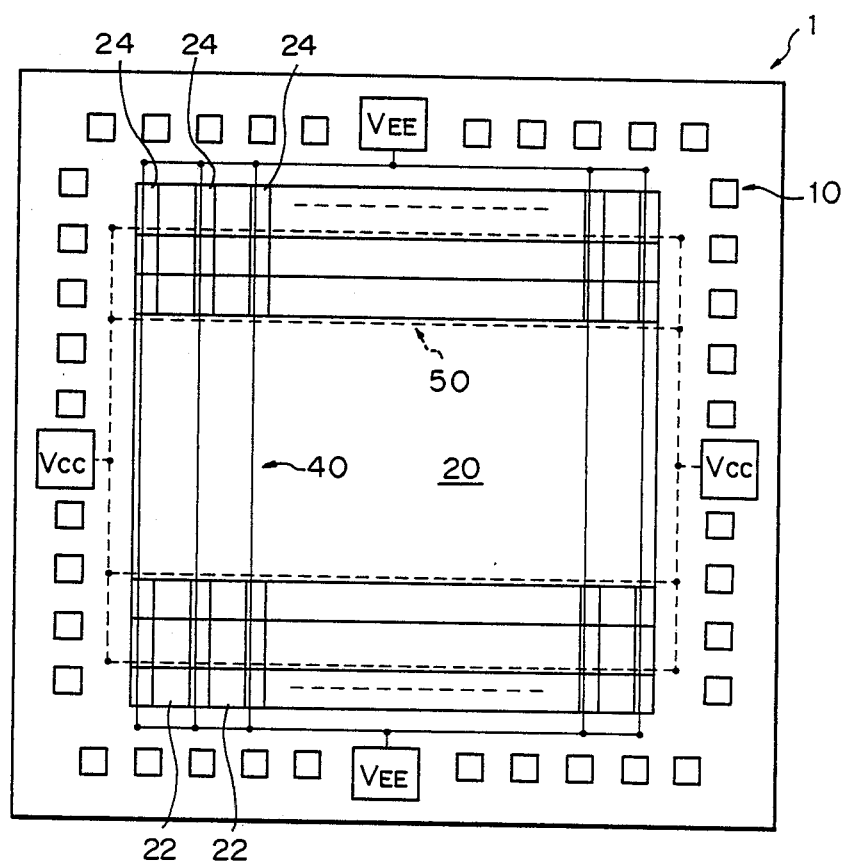
FIG. 6 is a plane view of an embodiment of a semiconductor chip of the master-slice-type semiconductor integrated circuit device in accordance with the present invention.

FIG. 6 illustrates a semiconductor chip of a masterslice-type semiconductor IC device of a preferred embodiment of the invention. The semiconductor chip 1 comprises a plurality of bonding pads 10 provided at an outer circumferential region, a plurality of basic cell groups 22 arranged inside the bonding pads 10, a plurality of current source cell groups 24, and first and second power feeding means 40 and 50 for supplying power from power sources $V_{EE}$ and $V_{CC}$ to the plurality of basic cell groups 22 and the plurality of current source cell groups 24. The basic cell groups 22 are arranged in a matrix and form a basic cell array 20. A current source cell group 24 is disposed between each two basic cell groups in the lateral (row) direction.

Figure 7:
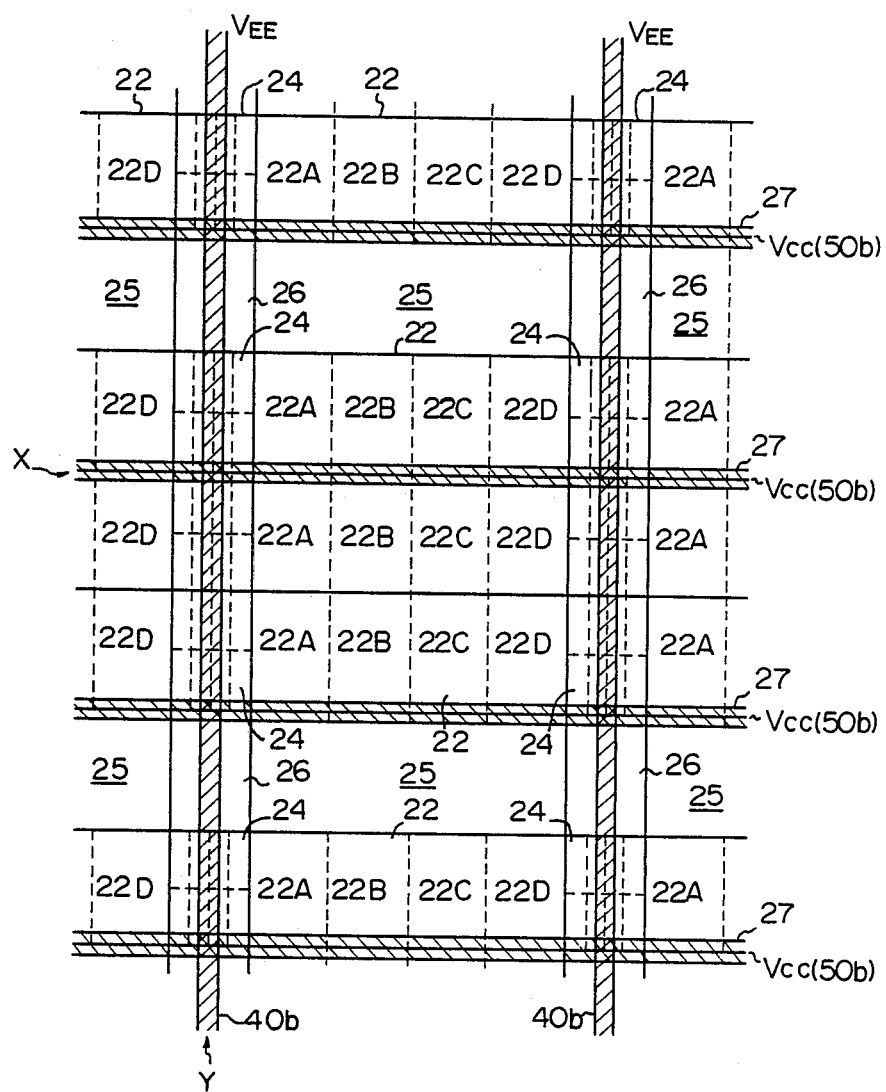
FIG. 7 is an enlarged view of part of the cell array shown FIG. 6.

Referring to FIG. 7, each basic cell group 22 is formed of four basic cells 22A to 22D. Similarly, each current source cell group 24 comprises eight current source cells, as shown by the dotted lines. Each basic cell includes a logic gate circuit, as shown by reference 22A in FIG. 10. The detailed construction of FIG. 7 and FIG. 10 will be explained later.

FIGS. 8(A) and 8(B) show the constructions of the first and second power feeding means 40 and 50, respectively. Each power feeding means 40 and 50 is constructed as a single layer. The first power feeding means 40, for connecting the power source $V_{EE}$ to the current source cell 24, comprises two common strips 40a, provided in a lateral direction and connected to the power source $V_{EE}$, and a plurality of longitudinal strips 40b, arranged in parallel at a predetermined distance with their ends connected to the common lateral strips 40a. The above strips form an integral unit. The first power feeding means 40 is of an electrically conductive material, such as aluminum (Al). The longitudinal parallel strips 40b are operatively connected to the current source cell 24.

The second power feeding means 50, for supplying power from the power source $V_{CC}$, comprises two common longitudinal strips 50a, connected to the power source $V_{CC}$, and a plurality of lateral strips 50b, arranged in parallel at a predetermined distance with their ends connected to the common longitudinal strips. The above strips also form an integral unit and are made of an electrically conductive material. The lateral parallel strips 50b are operatively connected to a basic cell 22.

FIGS. 9(A) and 9(B) are partial cross-sectional views of the first and second power feeding means 40 and 50. FIG. 9(A) is a view from arrow X in FIG. 7. FIG. 9(B) is a view from arrow Y in FIG. 7. The first power feeding means 40 and the second power feeding means 50 are formed on two different, single layers. The first power feeding means 40 is formed on a higher layer, i.e., a second layer in the chip 1. The second power feeding means 50 is formed on a lower layer, i.e., a first layer in the chip 1.

Referring to FIGS. 1 and 7 to 9, the plurality of longitudinal parallel strips 40b of the first power feeding means 40 and the plurality of lateral parallel strips 50b of the second power feeding means 50 form a lattice-like structure. The longitudinal parallel strips 40b of the first power feeding means 40 perpendicularly intersect the lateral parallel strips 50b of the second power feeding means 50. Each longitudinal parallel strip 40b of the first power feeding means 40 is arranged above the current source cell groups 24 in the longitudinal direction of the chip 1. Each lateral parallel strip 50b of the second power feeding means 50 is arranged adjacent to one side of the basic cell groups 22 in the lateral direction of the chip 1.

As shown in FIG. 7 and mentioned above, four basic cells 22A to 22D form a basic cell group 22. Eight current source cells $PWR_1$ to $PWR_8$ form a current source group 24. The basic cell groups 22 form a matrix. In a row of the matrix, or in the lateral direction of the semiconductor chip 1, a current source group 24 is disposed between each two basic cell groups. In FIG. 7, three consecutive rows, each comprising a plurality of the basic cell groups 22 and a plurality of current source groups 24, are illustrated. Between each three consecutive rows of the basic cell groups and the current source groups, a supplemental cell row comprising bias power circuits 25 and capacitor circuits 26 is disposed. Extending in the lateral direction, wiring channels 27 are arranged adjacent to one of the longitudinal sides of the basic cell groups 22. In FIGS. 1 and 7 to 9, input wirings, output wirings, and other wirings arranged on the same layer as the first power feeding means 40 are omitted to simplify the drawings.

Figure 10:
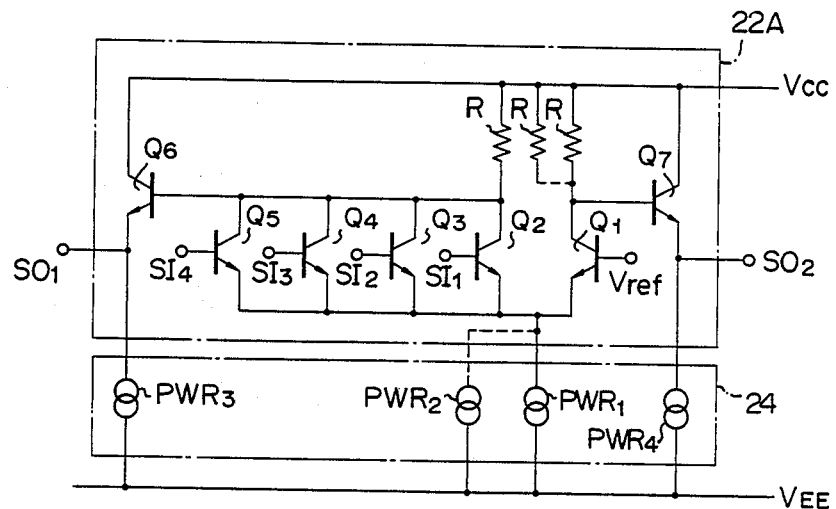
FIG. 10 is a circuit diagram of an example of a circuit formed by a basic cell and a current source cell shown in FIG. 7.

FIG. 10 illustrates a logic gate circuit formed by use of a basic cell 22A and a current source cell group 24 in which the current source cells $PWR_1$ to $PWR_4$ are connected between the power sources $V_{CC}$ and $V_{EE}$. The logic gate circuit shown in FIG. 10 is an ECL gate circuit, similar to that in FIG. 2, however, the circuit of FIG. 10 has four inputs $SI_1$ to $SI_4$ and two complementary outputs $SO_1$ and $SO_2$ and is formed by transistors $Q_1$ to $Q_7$, resistors R, and current source cells $PWR_1$ to $PWR_4$.

Figure 11:
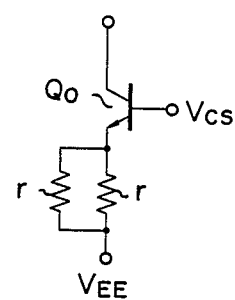
FIG. 11 is a circuit diagram of an example of a current source cell of the circuit shown in FIG. 10.

FIG. 11 illustrates a specific circuit of the current source cell $PWR_1$. The current source cell $PWR_1$ comprises a transistor $Q_0$ and a resistor r operatively connected to an emitter of the transistor $Q_0$ at one terminal and to the first power feeding means connected to $V_{EE}$. A collector C of the transistor $Q_0$ is operatively connectable to any one of the basic cells. The bias voltage $V_{CS}$ applied to a base of the transistor $Q_0$ is fed from the bias power source cell 25 shown in FIG. 7. All current source cells PWR have the same capacity, for example, 500 μA, for driving one low-power-consumption circuit. When a high-power-consumption gate circuit is required, two current source cells $PWR_1$ and $PWR_2$ can be used for applying 1 mA, as shown by the dotted line in FIG. 10.

Figure 12:
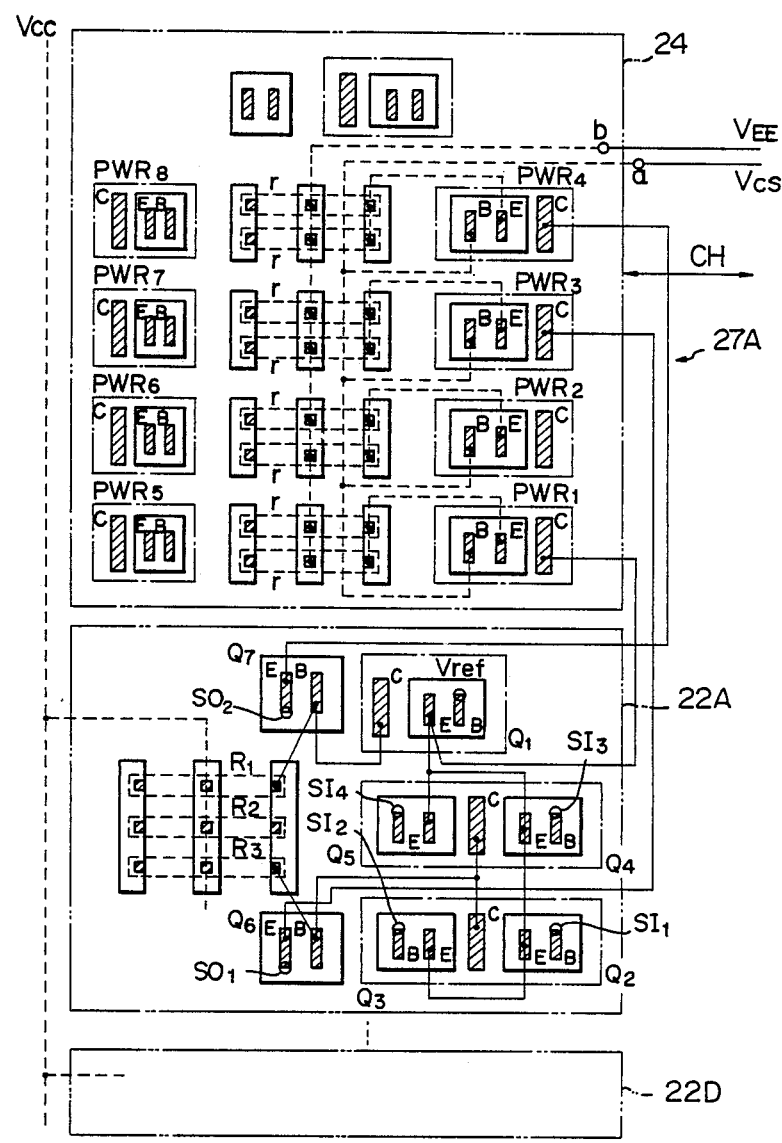
FIG. 12 is a detailed view of one circuit on the semiconductor chip shown in FIG. 7 corresponding to the circuit shown in FIG. 10.

Referring to FIG. 12, a more specific arrangement for realizing the circuits in FIGS. 10 and 11 will now be described. In FIG. 12, current source cells $PWR_1$ to $PWR_8$, each of which comprises a transistor $Q_0$ and resistor r as shown in FIG. 11; transistors $Q_1$ to $Q_7$; first to third resistors R; and strips of the first and second power feeding means 40 and 50 are commonly formed for all semifinished IC devices in the master-slice method. In FIG. 12, references B, E, and C designate a base, emitter, and collector of a transistor.

Note that a group of basic cells 22A to 22D and a group of current source cells $PWR_1$ to $PWR_8$ are separately arranged, i.e., all may be freely used for making the logic gate circuits. Also note that one group of basic cells and one group of current source cells are compactly formed to improve the degree of integration of the semiconductor IC device and to minimize the wiring length in each cell.

In one embodiment, the power feeding connections, as shown by dotted lines, are also commonly processed. In the wiring of a current source cell 24, the strip feeding the bias voltage $V_{CS}$ generated in the adjacent bias circuit 25 in accordance with the power source $V_{EE}$ is provided on the higher layer, i.e., the layer provided with the strip of the power source $V_{EE}$ (shown by the solid line); introduced in the cell 24 down to the lower layer, i.e., the layer provided with the strips of the power source $V_{CC}$, by a through hole indicated by a reference a; and finally operatively connected to the bases B of the transistors $Q_0$ in the current source cells $PWR_1$ to $PWR_4$. Similarly, the strip of the power source $V_{EE}$ (shown by a solid line) is provided on the higher layer; introduced in the cell 24 down to the lower layer by a through hole indicated by a reference b; and finally operatively connected to one end of the resistors r. Furthermore, the other ends of the pairs of resistors are operatively connected to the corresponding emitter E of the transistors $Q_0$ in the current source cells $PWR_1$ to $PWR_4$. With respect to the wiring in the basic cell 22A, the strip feeding the power source $V_{CC}$ formed adjacent to one side of the basic cells 22A to 22D and on the lower layer is introduced into the basic cell 22A and is operatively connected to one end of the resistors R and the collectors C of the transistors $Q_6$ and $Q_7$ (the connections are not shown).

In addition, the following wiring is formed in the common process. In the basic cell 22A, the common collector C of the transistors $Q_2$ and $Q_3$ and the common collector C of the transistors $Q_4$ and $Q_5$ and also their common connected point and the base B of the transistor $Q_6$ are operatively connected by conductive strips provided in the same layer as the $V_{EE}$ strip. The base B of the transistor $Q_6$ and the other end of the resistor $R_3$ are operatively connected. The emitters E of the transistors $Q_1$ to $Q_5$ are operatively connected. The collector C of the transistor $Q_1$ and the base B of the transistor $Q_7$ are operatively connected. The common connected point is operatively connected to the other end of the resistor $R_1$. A reference voltage strip for applying the reference voltage $V_{ref}$ from the bias circuit 25 formed on the higher layer is operatively connected to the base B of the transistor $Q_1$ and is formed in the lower layer.

The above wiring is commonly formed on all basic cells 22A to 22D and all the current source cells $PWR_1$ to $PWR_8$ of each current source cell group 24 in the semiconductor chip 1.

In order to complete the logic gate circuit shown in FIG. 10, the further following wiring must be formed. The collector C of the transistor $Q_0$ of $PWR_1$ in the current source cell group 24 and the emitter E of the transistor $Q_1$ in the basic cell 22A are operatively connected. In more detail, the conductive strip connecting the collector C of the transistor $Q_0$ and the emitter E of the transistor $Q_1$ is formed by three sections. An extraction (or introduction) portion runs from the emitter E of the transistor $Q_1$ to the wiring channel CH formed adjacent to the other side of the basic cells. A wiring channel running portion and an introduction (or extraction) portion from the wiring channel CH to the collector C of the transistor $Q_0$ complete the connection. Similarly, the emitter E of the transistor $Q_6$ in the basic cell 22A is connected to the collector C of the transistor $Q_0$ in the current source cell $PWR_3$ and the emitter E of the transistor $Q_7$ in the basic cell 22A is connected to the collector C of the transistor $Q_0$ in the current source cell $PWR_4$.

Figure 13:
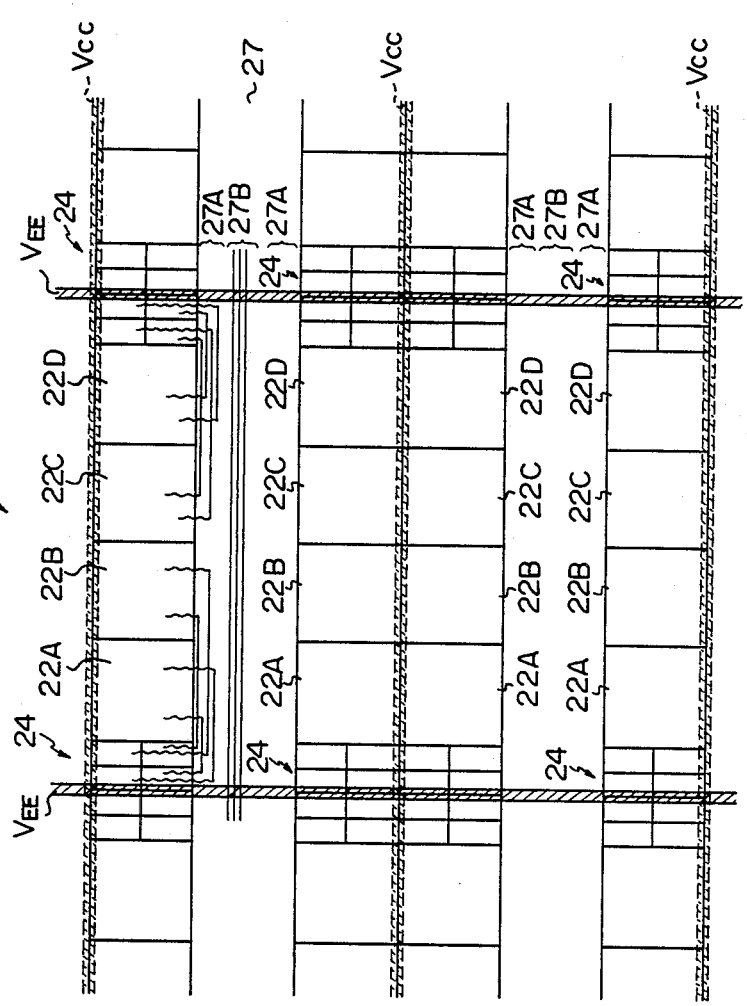
FIG. 13 is a plane view corresponding to FIG. 7, for illustrating the connections between cells.

Referring to FIG. 13, the above wiring connection between the basic cells and the current source cells is effected in a region 27A in the wiring channel 27 positioned close to one edge of the basic cells 22A–22D.

Finally, conductive strips connected to the bases B of the transistors $Q_2$ to $Q_5$ for applying the input signals $SI_1$ to $SI_4$ and to the emitters E of the transistors $Q_6$ and $Q_7$ are accommodated in a middle region 27B in the wiring channel 27. These conductive strips may be connected to other logic gate circuits for forming a more complex logic gate circuit, to bonding pads 10 for connecting the external circuits through the pins of the semiconductor IC device, or to the high-power-consumption logic gate circuits, if required.

With regard to forming the high-power-consumption logic gate circuit indicated by the additional dotted lines in FIG. 10, the further wiring connection between the other end of the middle resistor $R_2$ and the base B of the transistor $Q_7$ in the basic cell 22A and between the collector C of the transistor $Q_0$ in $PWR_2$ and the emitter E of the transistor $Q_3$ is easily effected through the region 27A in the wiring channel 27, as above.

As mentioned above, both low and high-power-consumption logic gate circuits can be easily formed without troublesome design effort. In the logic gate circuit shown in FIG. 10, three current source cells $PWR_1$ to $PWR_3$ are required for the low-power-consumption embodiment and four source cells $PWR_1$ to $PWR_4$ for the high-power-consumption embodiment. In general, however, the logic gate circuit is similar to FIG. 2 and only two current sources are required, like the circuit shown in FIG. 2. In addition, a current source cell, for example, $PWR_1$, can drive two or more transistors forming the ECL gate. Accordingly, in normal application, the four current source cells $PWR_1$, $PWR_2$, $PWR_7$ and $PWR_8$ are used for the basic cells 22A and 22B, to the right of the current source cell group 24 and the four current source cells $PWR_3$ to $PWR_8$ are used for the basic cells 22C and 22D on the left, as shown in FIG. 13. Other uses are also possible. As clearly understood, not only four, but any number of basic cells may be provided in a basic cell group 22 depending on the complexity of the circuits to be formed, the desired degree of integration of the device, and other factors. Similarly, the number of the current source cells in a current source cell group 24 can be suitably chosen.

In the above embodiment, each basic cell comprised a plurality of transistors $Q_1$ to $Q_7$ and a plurality of resistors R for making an ECL gate circuit. Instead of this, the basic cells may comprises various alternative elements for, e.g., making an integrated injection logic ($I^2L$) gate.

Figures 14A, 14B, 14C:
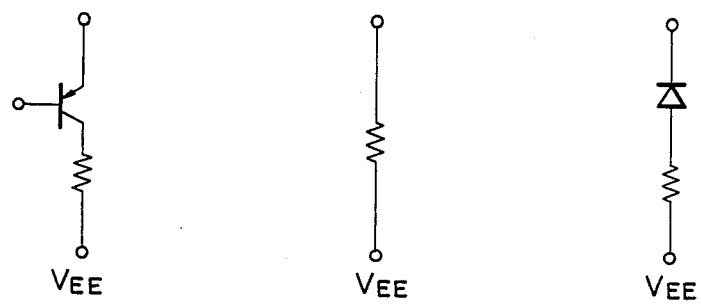
FIGS. 14(A) and (B) are circuit diagrams of other examples of current source cells of the circuit shown in FIG. 10.

Instead of the current source cell shown in FIG. 11, simpler current source circuits are available such as the circuits shown in FIGS. 14(A) to 14(B). When the circuit shown in FIG. 14(B) is applied, the bias voltage cells 25 can be deleted, whereby the arrangement shown in FIG. 7 becomes simpler and the semiconductor IC device can be made denser. The capacitor cells 26 also may be deleted, if not required.

The provision of the wiring channels 27, each of which is disposed between rows of the basic cell groups 22 and the current source cell groups 24, contributes to efficient wiring connection between a basic cell and the current source cells and between several basic cells. Division of the wiring channel into the middle path 27B mainly for providing input and output conductive strips and the side paths 27A mainly for forming the strips connecting a basic cell and current source cell facilitates wiring connection design and reduces the wiring complexity.

The wiring channel region may be somewhat greater than that of the prior art, however, the basic cell region and the current source region are considerably reduced in size. As a result, the total degree of integration of the device can be improved.

In FIG. 7, three rows, each comprising basic cell groups 22 and current source cell groups 24 disposed therebetween, are consecutively arranged. In FIG. 13, two rows are consecutively arranged. Three consecutive rows means a higher integration density, but increases the complexity of wiring connections in the wiring channels. To simplify the wiring connections, a two- or even one-row arrangement is preferable.

Figure 15:
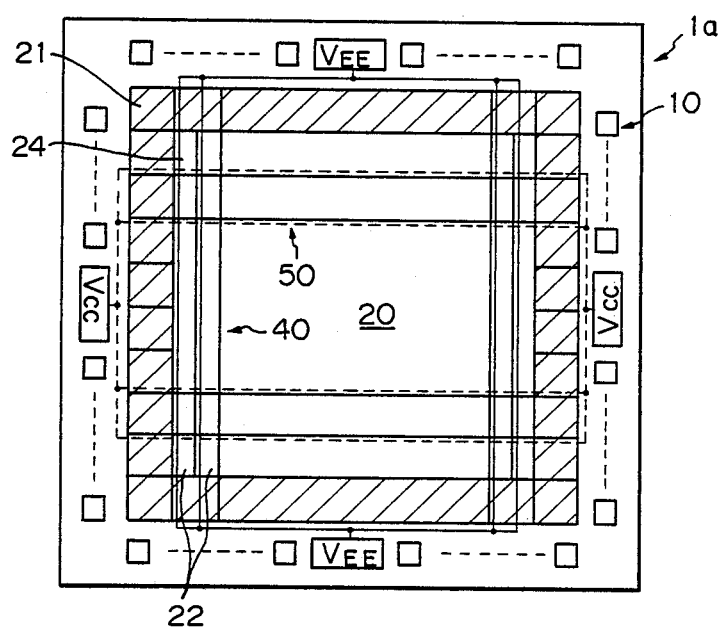
FIG. 15 is a plane view of another embodiment of a semiconductor chip of the master-slice-type semiconductor integrated circuit device in accordance with the present invention.

Referring to FIG. 15, another embodiment of the present invention will now be described. A semiconductor chip 1a of a master-slice-type semiconductor IC device comprises a plurality of bonding pads 10 provided at an outer circumferential region, a plurality of input and output gate cells 21 arranged inside of the bonding pads 10, a plurality of basic cell groups 22 forming a basic cell array 20 provided inside of the input and output gate cells 21, and first and second power feeding means 40 and 50. In the embodiment, additional input and output gate cells 21, each of which may be a high-power-consumption logic gate type, as shown by the solid and dotted lines in FIG. 10, are provided for the improvement of the input and output interface. Note that each input and output gate cell 21 is formed by a combination of a basic cell 22 and current source cell 24.

Other members in the semiconductor chip 1a in FIG. 15 are similar to those mentioned above with reference to FIGS. 6 to 14. Accordingly, a high-power-consumption logic gate circuit may be formed in the cell array 20.

As explained above, several advantages are provided by the present invention. First, since the basic cells for the logic gate and the current cells which are used for providing the constant current to the basic cells are arranged separately in groups, the number of current sources for one basic cell can be varied depending upon, for instance, the desired power of the basic cell. Therefore, the flexibility is increased. Second, the basic cells which are connected to the first power source $V_{CC}$ are arranged laterally, and the current source cell groups which are connected to the second power source $V_{EE}$ are arranged longitudinally. As a result, the first power source wiring $V_{CC}$ and the second power source wiring $V_{EE}$ can be formed separately, each in a single conducting layer so that the space for signal lines connecting the cells is increased in each conducting layer.

We claim:

1. A master-slice-type semiconductor integrated circuit device, comprising:
   a semiconductor substrate;
   basic cell blocks each including basic cells formed on said substrate, each of said basic cells having at least one logical circuit element, and said basic cell blocks being arranged in a plurality of parallel rows, said plurality of parallel rows together forming a matrix on said semiconductor substrate;
   said parallel rows being spaced from each other forming wiring channel areas extending parallel to the rows and lying between each adjacent pair of parallel rows;
   current source cells formed separately from and adjacent to said basic cell blocks within said rows and for supplying current to said basic cells, each of said current source cells having at least one current source element; and
   logic circuit wiring forming logic circuits by connecting at least one logical circuit element in one of said basic cells and at least one current source element in one of said current source cells in the same row as the basic cell block containing said at least one logical circuit element, to form each of the logic circuits, said logic circuit wiring being formed within said wiring channel area and extending along said wiring channel area parallel to the row containing said at least one current source element and said at least one logical circuit element.

2. A master-slice-type semiconductor integrated circuit device according to claim 1, wherein said basic cells are arranged at predetermined distances in a matrix.

3. A master-slice-type semiconductor integrated circuit device according to claim 2, wherein each of said current source cells is arranged separate from each basic cell.

4. A master-slice-type semiconductor integrated circuit device according to claim 3, wherein each of said current source cells is adjacent to one of said basic cells.

5. A master-slice-type semiconductor integrated circuit device according to claim 1,
   wherein said device includes other elements and further comprises first conductive strips, disposed in said wiring channels, connecting the other elements, and
   wherein said logic circuit wiring comprises second conductive strips, disposed in said wiring channels, connecting the at least one logical circuit element in one of said basic cells and the at least one logical circuit element in another of said basic cells and connecting the at least one logical circuit element in one of said basic cells and the at least one current source element in one of said current source cells to form each of the logic circuits.

6. A master-slice-type semiconductor integrated circuit device according to claim 5, wherein each of said wiring channels is arranged adjacent to both one of said basic cells and one of said current source cells.

7. A master-slice-type semiconductor integrated circuit device according to claim 1, wherein said basic cells are formed in basic cell groups, each of said basic cell groups comprising a closely arranged series of said basic cells in a lateral direction of said device, said basic cell groups being formed in a matrix.

8. A master-slice-type semiconductor integrated circuit device according to claim 7, wherein said current source cells are formed in current source cell groups, each of said current source cell groups comprising closely arranged current source cells.

9. A master-slice-type semiconductor integrated circuit device according to claim 8, wherein each of said current source cell groups is disposed between said basic cell groups and a plurality of cell rows are formed in said device.

10. A master-slice-type semiconductor integrated circuit device according to claim 9,
wherein said device includes other elements and further comprises first conductive strips, disposed in said wiring channels, connecting the other elements, and
wherein said logic circuit wiring comprises second conductive strips, disposed in said wiring channels, connecting the at least one logical circuit element in one of said basic cells and the at least one logical circuit element in another of said basic cells and connecting the at least one logical circuit element in one of said basic cells and the at least one current source element in one of said current source cells to form each of the logic circuits.

11. A master-slice-type semiconductor integrated circuit device according to claim 10, wherein each of said wiring channels is arranged adjacent to one side of one of the cell rows and extends in the lateral direction of said device.

12. A master-slice-type semiconductor integrated circuit device according to claim 9, wherein the cell rows are closely arranged in sets of two in a longitudinal direction of the device, substantially perpendicular to the lateral direction in which the cell rows extend.

13. A master-slice-type semiconductor integrated circuit device according to claim 12,
wherein said device includes other elements and further comprises first conductive strips, disposed in said wiring channels, connecting the other elements, and
wherein said logic circuit wiring comprises second conductive strips, disposed in said wiring channels, connecting the at least one logical circuit element in one of said basic cells and the at least one logical circuit element in another of said basic cells and connecting the at least one logical circuit element in one of said basic cells and the at least one current source element in one of said current source cells to form each of the logic circuits.

14. A master-slice-type semiconductor integrated circuit device according to claim 9, wherein the cell rows are closely arranged in sets of three in a longitudinal direction of the device, substantially perpendicular to the lateral direction in which the cell rows extend.

15. A master-slice-type semiconductor integrated circuit device according to claim 14,
wherein said device includes other elements,
wherein each of the sets of three cell rows comprises first, second and third cell rows, the second cell row being disposed between the first and third cell rows in the longitudinal direction,
wherein said device further comprises:
wiring channel sets, each corresponding to one of the sets of the cell rows and comprising first and second wiring channels of said wiring channels, the first wiring channel being disposed between the first and second cell rows of the corresponding set of the cell rows and the second wiring channel being disposed adjacent to the third cell row on a side opposite the second cell row of the corresponding set of the cell rows; and
first conductive strips, disposed in said wiring channel sets, connecting the other elements in said device, and wherein said logic circuit wiring comprises second conductive strips, disposed in said wiring channel sets, connecting the at least one logical circuit element in one of said basic cells and the at least one logical circuit element in another of said basic cells and connecting the at least one logical circuit element in one of said basic cells and the at least one current source element in one of said current source cells to form each of the logic circuits.

16. A master-slice-type semiconductor integrated circuit device according to claim 1, wherein all of said basic cells have an identical logical circuit element.

17. A master-slice-type semiconductor integrated circuit device according to claim 16, wherein each of said basic cells include a low-power-consumption logic circuit element.

18. A master-slice-type semiconductor integrated circuit device according to claim 16, wherein each of said basic cells include a high-power-consumption logic circuit element.

19. A master-slice-type semiconductor integrated circuit device according to claim 1, wherein said basic cells comprise low-power-consumption and high-power-consumption logical circuit elements.

20. A master-slice-type semiconductor integrated circuit device according to claim 19, wherein said device has inner and outer regions, the high-power-consumption logical circuit elements are arranged in the outer region and the low-power-consumption logical circuit elements are arranged in the inner region.

21. A master-slice-type semiconductor integrated circuit device according to claim 1, 16, 17, 18, 19, or 20, wherein all of current source cells have the an identical current source circuit element.

22. A master-slice-type semiconductor integrated circuit device according to claim 1, wherein the at least one logical circuit element in said basic cell is a logical gate circuit operatively connected to the current source element in one of said current source cells.

23. A master-slice-type semiconductor integrated circuit device according to claim 22, wherein the logical gate circuit is an emitter-coupled logic gate circuit.

24. A master-slice-type semiconductor integrated circuit device according to claim 22, wherein the logical gate circuit is an integrated injection logic gate circuit.

25. A master-slice-type semiconductor integrated circuit device according to claim 1, wherein the at least one current source element in each of said current source cells comprises:
a transistor; and
a resistor operatively connected to the transistor in series.

26. A master-slice-type semiconductor integrated circuit device according to claim 1, wherein the at least one current source element in each of said current source cells comprises a resistor.

27. A master-slice-type semiconductor integrated circuit device, comprising:
a semiconductor substrate;
basic cell blocks each including basic cells formed on said substrate, each of said basic cells having at least one logical circuit element, said basic cell blocks being arranged in parallel rows forming a matrix on said semiconductor substrate and said parallel rows being spaced apart from each other;

wiring channel areas being formed between adjacent spaced apart parallel rows and extending parallel to the rows;

current source cells formed separately from and adjacent to said basic cell blocks within said rows and for supplying a current to said basic cells, each having at least one current source element;

first and second power feeding means for supplying current to said basic cells and said current source cells, said first and second power feeding means being formed on different, single layers in a direction perpendicular to said wiring channel areas; and logic circuit wiring forming logic circuits by operatively connecting at least one logical circuit element in one of said basic cells and at least one current source element in one of said current source cells in the same row as said basic cell containing said at least one logical circuit element, to form each of the logic circuits, said logic circuit wiring being formed in said wiring channel areas and extending parallel to the row containing said at least one current source element and said at least one logical circuit element.

28. A master-slice-type semiconductor integrated circuit device according to claim 27, wherein aid first power feeding means comprises first parallel strips parallel to each other and said second power feeding means comprises second parallel strips parallel to each other and perpendicular to the first parallel strips of said first power feeding means, the first and second parallel strips forming a lattice structure.

29. A master-slice-type semiconductor integrated circuit device according to claim 28, wherein each of the first parallel strips of said first power feeding means is arranged adjacent to one of said current source cells and each of the second parallel strips of said second power feeding means is arranged adjacent to one of said basic cells.

30. A master-slice-type semiconductor integrated circuit device according to claim 27, wherein said basic cells are arranged at predetermined distances in a matrix.

31. A master-slice-type semiconductor integrated circuit device according to claim 30, wherein each of said current source cells is arranged separate from each basic cell.

32. A master-slice-type semiconductor integrated circuit device according to claim 31, wherein each of said current source cells is adjacent to one of said basic cells.

33. A master-slice-type semiconductor integrated circuit device according to claim 27,
wherein said device includes other elements and further comprises first conductive strips, disposed in said wiring channels, connecting the other elements, and
wherein said logic circuit wiring comprises second conductive strips, disposed in said wiring channels, connecting the at least one logical circuit element in one of said basic cells and the at least one logical circuit element in another of said basic cells and connecting the at least one logical circuit element in one of said basic cells and the at least one current source element in one of said current source cells to form each of the logic circuits.

34. A master-slice-type semiconductor integrated circuit device according to claim 33, wherein each of said wiring channels is arranged adjacent to at least one of said basic cells and at least one of said current source cells.

35. A master-slice-type semiconductor integrated circuit device according to claim 27, wherein said basic cells are formed in basic cell groups, said basic cells in each of said basic cell groups being closely arranged in a series, said basic cell groups being formed in a matrix.

36. A master-slice-type semiconductor integrated circuit device according to claim 35, wherein said current source cells are formed in current source cell groups, each of said current source cell groups comprising closely arranged current source cells.

37. A master-slice-type semiconductor integrated circuit device according to claim 36, wherein each of said current source cell groups is disposed between said basic cell groups and a plurality of cell rows are formed in said device.

38. A master-slice-type semiconductor integrated circuit device according to claim 37,
wherein said device includes other elements and further comprises first conductive strips, disposed in said wiring channels, connecting the other elements, and
wherein said logic circuit wiring comprises second conductive strips, disposed in said wiring channels, connecting the at least one logical circuit element in one of said basic cells and the at least one logical circuit element in another of said basic cells and connecting the at least one logical circuit element in one of said basic cells and the at least one current source element in one of said current source cells to form each of the logic circuits.

39. A master-slice-type semiconductor integrated circuit device according to claim 38, wherein each of said wiring channels is arranged adjacent to one side of one of the cell rows and extends in the lateral direction of the device.

40. A master-slice-type semiconductor integrated circuit device according to claim 37, wherein the cell rows are closely arranged in sets of two in a longitudinal direction of the device substantially perpendicular to the lateral direction in which the cell rows extend.

41. A master-slice-type semiconductor integrated circuit device according to claim 40,
wherein said device includes other elements said wiring channels are each disposed between two of the sets of the cell rows and said device further comprises first conductive strips, disposed in said wiring channels, connecting the other elements, and
wherein said logic circuit wiring comprises second conductive strips, disposed in said wiring channels, connecting the at least one logical circuit element in one of said basic cells and the at least one logical circuit element in another of said basic cells and connecting the at least one logical circuit element in one of said basic cells and the at least one current source element in one of said current source cells to form each of the logic circuits.

42. A master-slice-type semiconductor integrated circuit device according to claim 37, wherein the cell rows are closely arranged in sets of three in a longitudinal direction of the device substantially perpendicular to the lateral direction in which the cell rows extend.

43. A master-slice-type semiconductor integrated circuit device according to claim 42,
wherein said device includes other elements, wherein each of the sets of three cell rows comprises first, second and third cell rows, the second cell row being disposed between the first and third cell rows in the longitudinal direction, wherein said device further comprises:

wiring channel sets, each corresponding to one of the sets of the cell rows and comprising first and second wiring channels of said wiring channels, the first wiring channel being disposed between the first and second cell rows of the corresponding set of the cell rows and the second wiring channel being disposed adjacent to the third cell row on a side opposite the second cell row of the corresponding set of the cell rows; and first conductive strips, disposed in said wiring channel sets, connecting the other elements in said device, and wherein said logic circuit wiring comprises second conductive strips, disposed in said wiring channel sets, connecting the at least one logical circuit element in one of said basic cells and the at least one logical circuit element in another of said basic cells and connecting the at least one logical circuit element in one of said basic cells and the at least one current source element in one of said current source cells to form each of the logic circuits.

44. A master-slice-type semiconductor integrated circuit device according to claim 27, wherein all of said basic cells have an identical logical circuit element.

45. A master-slice-type semiconductor integrated circuit device according to claim 44, wherein each of said basic cells include a low-power-consumption logic circuit element.

46. A master-slice-type semiconductor integrated circuit device according to claim 44, wherein each of said basic cells include a high-power consumption logic circuit element.

47. A master-slice-type semiconductor integrated circuit device according to claim 27, wherein said basic cells comprise low-power-consumption and high-power-consumption logical circuit elements.

48. A master-slice-type semiconductor integrated circuit device according to claim 47, wherein said device has inner and outer regions, the high-power consumption logical circuit elements are arranged in the outer region and the low-power-consumption logical circuit elements are arranged in the inner region.

49. A master-slice-type semiconductor integrated circuit device according to claim 28, 44, 45, 46, 47 or 48, wherein all of the current source cells have an identical current source circuit element.

50. A master-slice-type semiconductor integrated circuit device according to claim 27, wherein the at least one logical circuit element in said basic cell is a logical gate circuit operatively connected to the at least one current source element in one of said current source cells.

51. A master-slice-type semiconductor integrated circuit device according to claim 50, wherein the logical gate circuit is an emitter-coupled logic gate circuit.

52. A master-slice-type semiconductor integrated circuit device according to claim 50, wherein the logical gate circuit is an integrated injection logic gate circuit.

53. A master-slice-type semiconductor integrated circuit device according to claim 27, wherein the at least one current source element in each of said current source cells comprises:

a transistor; and a resistor operatively connected to the transistor in series.

54. A master-slice-type semiconductor integrated circuit device according to claim 27, wherein the at least one current source element in each of said current source cells comprises a resistor.

55. A master-slice-type semiconductor integrated circuit device according to claim 2 or 30, wherein said current source cells are closely arranged in current source cell groups and each of said basic cells include more than one logical circuit element, whereby the current source and logical circuit elements are separated by the grouping of said current source cells in the current source cell groups.

56. A master-slice-type semiconductor integrated circuit device according to claim 5 or 33, wherein all of said basic cells and all of said current source cells are adjacent to at least one of said wiring channels.

57. A master-slice-type semiconductor integrated circuit device according to claim 10 or 38, wherein all of said basic cells and all of said current source cells are adjacent to at least one of said wiring channels.

58. A master-slice-type semiconductor integrated circuit device according to claim 10 or 38, wherein each of said wiring channels comprises:

at least one side region, adjacent to one the cell rows, for accommodating the second conductive strips; and a middle region for accommodating the first conductive strips.

59. A master-slice-type semiconductor integrated circuit device according to claim 12, 14, 40 or 42, further comprising supplemental cell rows, each of the supplemental cell rows, arranged adjacent to at least one of the cell rows in each of the sets of the cell rows, comprising bias power circuits and capacitor circuits.

* * * * *

UNITED STATES PATENT AND TRADEMARK OFFICE
CERTIFICATE OF CORRECTION

PATENT NO. : 4,748,488

DATED : May 31, 1988

INVENTOR(S) : Suzuki et al.

It is certified that error appears in the above-identified patent and that said Letters Patent is hereby corrected as shown below:

Column 1, line 62, "lattice like-" should be --lattice-like--.

Column 2, line 37, delete "as".

Column 3, line 8, after "shown" insert --in--.

Column 4, line 18, "the" should be --an-- and "an" should be --the--;

lines 39 and 40, "neighbouring" should be --neighboring--.

Column 8, line 56, "comprises" should be --comprise--.

Column 12, line 34, delete "the".

Column 13, line 26, "aid" should be --said--.

Column 15, line 50, "28" should be --27--.

Column 16, line 42, after "one" (second occurrence), insert --of--.

Signed and Sealed this

Thirteenth Day of September, 1988

Attest:

DONALD J. QUIGG

*Attesting Officer*    *Commissioner of Patents and Trademarks*